(12) United States Patent
Toshima et al.

(10) Patent No.: US 8,998,552 B2
(45) Date of Patent: Apr. 7, 2015

(54) PROCESSING APPARATUS AND PROCESSING METHOD

(75) Inventors: Masato Toshima, Sunnyvale, CA (US); Linh Can, San Jose, CA (US)

(73) Assignee: Orbotech LT Solar, LLC., San Jose, CA (US)

( * ) Notice: Subject to any disclaimer, the term of this patent is extended or adjusted under 35 U.S.C. 154(b) by 1124 days.

(21) Appl. No.: 12/934,629

(22) PCT Filed: Mar. 24, 2009

(86) PCT No.: PCT/JP2009/055818
§ 371 (c)(1),
(2), (4) Date: Mar. 1, 2011

(87) PCT Pub. No.: WO2009/119580
PCT Pub. Date: Oct. 1, 2009

(65) Prior Publication Data
US 2011/0144799 A1    Jun. 16, 2011

(30) Foreign Application Priority Data
Mar. 25, 2008    (JP) .................. 2008-078764

(51) Int. Cl.
H01L 21/677 (2006.01)

(52) U.S. Cl.
CPC .... *H01L 21/67706* (2013.01); *H01L 21/67721* (2013.01); *H01L 21/6776* (2013.01)

(58) Field of Classification Search
CPC ................... H01L 21/67715; H01L 21/67748
USPC ........................................................ 414/217
See application file for complete search history.

(56) References Cited

U.S. PATENT DOCUMENTS 5,178,638 A * 1/1993 Kaneko et al. ............... 29/25.01
5,215,420 A * 6/1993 Hughes et al. ................ 414/217

(Continued)

FOREIGN PATENT DOCUMENTS

CN    102046840 A    5/2011
CN    102751158 A    10/2012

(Continued)

OTHER PUBLICATIONS

International Search Report for PCT/JP2009/055818 dated Jun. 16, 2009.

(Continued)

*Primary Examiner* — Jonathan Snelting
(74) *Attorney, Agent, or Firm* — Nixon Peabody LLP; Joseph Bach, Esq.

(57) ABSTRACT

To provide a processor and a processing method to make the operation to load and unload workpieces to and from a processing chamber more efficient, and improve workpiece processing efficiency.
A processor equipped with a processing chamber 10 wherein a first supply/discharge port and a second supply/discharge port have been provided, characterized by being equipped with a first transport mechanism to perform an operation to supply and discharge workpieces 30 via the aforementioned first supply/discharge port, a second transport mechanism to perform an operation to supply and discharge workpieces 30 via the aforementioned second supply/discharge port, an exchange means to deliver workpieces 30*a* that have been loaded for processing by the aforementioned first transport mechanism to the aforementioned second transport mechanism, and deliver workpieces 32*a* that have been loaded for processing by the aforementioned second transport mechanism to the first transport mechanism, and a control unit 22 to drive the aforementioned first transport mechanism and second transport mechanism, and alternately supply unprocessed workpieces from the aforementioned first supply/discharge port and the aforementioned second supply/discharge port to the aforementioned processing chamber for processing.

26 Claims, 10 Drawing Sheets

(56) References Cited

U.S. PATENT DOCUMENTS

| | | | |
|---|---|---|---|
| 5,425,611 A * | 6/1995 | Hughes et al. | 414/217 |
| 5,759,334 A | 6/1998 | Kojima et al. | |
| 5,795,399 A | 8/1998 | Hasegawa et al. | |
| 6,064,629 A * | 5/2000 | Stringer et al. | 367/128 |
| 6,176,668 B1 * | 1/2001 | Kurita et al. | 414/217 |
| 6,286,230 B1 * | 9/2001 | White et al. | 34/403 |
| 6,517,303 B1 * | 2/2003 | White et al. | 414/217 |
| 6,746,198 B2 * | 6/2004 | White et al. | 414/222.13 |
| 7,841,820 B2 * | 11/2010 | Bonora et al. | 414/217.1 |
| 8,403,613 B2 * | 3/2013 | van der Meulen | 414/217 |
| 8,408,858 B2 * | 4/2013 | Guo et al. | 414/217 |
| 2002/0080291 A1 | 6/2002 | Takahashi | |
| 2003/0003767 A1 * | 1/2003 | Kim et al. | 438/763 |
| 2006/0177288 A1 * | 8/2006 | Parker et al. | 414/217 |
| 2008/0233283 A1 * | 9/2008 | Choi et al. | 427/226 |
| 2011/0144799 A1 | 6/2011 | Toshima et al. | |

FOREIGN PATENT DOCUMENTS

| | | |
|---|---|---|
| EP | 1278230 A2 | 1/2003 |
| EP | 2261391 A1 | 12/2010 |
| JP | 63-276239 A | 11/1988 |
| JP | 4-78125 A | 3/1992 |
| JP | 8-316286 A | 11/1996 |
| JP | 2000-208587 A | 7/2000 |
| JP | 2001-210695 A | 8/2001 |
| JP | 2002-203885 A | 7/2002 |
| JP | 2002-270880 A | 9/2002 |
| JP | 2002-288888 A | 10/2002 |
| JP | 2003-68819 A | 3/2003 |
| JP | 2003-258058 A | 9/2003 |
| JP | 2005-019739 A | 1/2005 |
| JP | 2009-120937 A | 6/2009 |
| WO | WO 2005/001925 A1 | 1/2005 |

OTHER PUBLICATIONS

First Office Action in Chinese Patent Application No. 200980119052.8 dated Oct. 27, 2011.

International Preliminary Report on Patentability for PCT/JP2009/055818 dated Sep. 28, 2010.

Extended Search Report for European Patent Application No. 09725876 dated Dec. 13, 2012.

Notice of Allowance for Japanese Patent Application No. 2008-078764 dated May 28, 2013.

Office Action for Chinese Patent Application No. 2014061200880070 dated Jun. 17, 2014.

Notice of Allowance for Japanese Patent Application No. 2013-154164 dated Aug. 12, 2014.

* cited by examiner

PROCESSING APPARATUS AND PROCESSING METHOD

RELATED APPLICATIONS

This application is a National Phase of International Application No. PCT/JP2009/055818, entitled "PROCESSING APPARATUS AND PROCESSING METHOD", which was filed on Mar. 24, 2009, and which claims priority of Japanese Patent Application No. 2008-078764, filed on Mar. 25, 2008, and the disclosures of which are hereby incorporated by reference herein in their entirety.

FIELD OF TECHNOLOGY

The invention concerns a processor and processing method for film-forming on a substrate or other workpiece or etching or other process.

BACKGROUND TECHNOLOGY

Manufacturing processes for solar battery panels and liquid crystal substrate involve plasma-enhanced chemical vapor deposition (CVD), plasma etching and various other processes for forming film on substrate (workpieces) and etching substrate (see Patent Reference 1 for example). In these processing lines, film-forming and other processes are performed while workpieces (substrate) are transported through processing chambers. These processes have been completely automated, and there is a strong demand to reduce the take time of each processing line, in order to improve mass-production efficiency.

In systems for processing workpieces (substrate) using linear transport, load lock chambers are provided in front and back of the processing chambers for film-forming and other processes, and after workpieces have been loaded into the loading side load lock chamber and blocked by the processing chamber, they are loaded into the processing chamber by vacuum pumping, and once the workpieces have been unloaded from the processing chamber into the unloading side load lock chamber, they unloaded from the load lock chamber by air release and blocked by the next processing chamber. That is, work pieces (substrate) are processed while transported from one side to the other side of a processor.

Patent Reference 1: Unexamined Patent Publication 2002-270880

Patent Reference 2: Unexamined Patent Publication 2000-208587

DISCLOSURE OF THE INVENTION

As described above, in the case of processors that perform required processes by linearly transporting workpieces, if the processing time of the processing chambers is of considerable length, then the processing time of the processing chambers will restrict productivity, while if the processing time of the processing chambers is short in comparison to the time required to load and unload workpieces in the load lock chambers, the loading and unloading of work pieces will restrict productivity.

For example, in solar battery panel manufacturing lines, there is a line for forming a reflection preventing film on the surface, but the time required for this film-forming is about 20 to 50 seconds. Consequently, if the time to vacuum pump and air release the load lock chambers is longer than this processing time, then the time required to load and unload workpieces will restrict productivity.

In order to improve product production efficiency, methods have been adopted in recent years for processing larger workpieces and processing more workpieces (substrate) at one time. In the case of such processing conditions, the processing time of the processing chambers is unchanged, but since the load lock chambers are enlarged, it is impossible to avoid lengthening the time required to vacuum pump or air release the load lock chambers. In such cases, a problem is that product production efficiency is restricted by the time required to load and unload work pieces.

The objective of the invention is to solve these problems, and provide a processor and processing method that enables efficient loading and unloading of workpieces to and from processing chambers, and efficient processing of workpieces.

A processor of the invention is one equipped with a processing chamber provided with a first supply/discharge port and a second supply/discharge port, which are each used to load unprocessed workpieces and unload processed workpieces, and is equipped with a first transport mechanism to perform an operation to load unprocessed workpieces into the processing chamber, via the aforementioned first supply/discharge port, and an operation to unload processed workpieces from the processing chamber, a second processing mechanism to perform an operation to load unprocessed workpieces into the processing chamber, via the aforementioned second supply/discharge port, and an operation to unload processed workpieces from the processing chamber, an exchange means to deliver workpieces loaded into the aforementioned processing chamber for processing by the aforementioned first transport mechanism to the aforementioned second processing mechanism, and deliver workpieces loaded into the processing chamber for processing by the aforementioned second transport mechanism to the first transport mechanism, and a control unit to control the aforementioned first transport mechanism, aforementioned second transport mechanism and aforementioned exchange means, and alternately perform supply/discharge operations for workpieces in the aforementioned first supply/discharge port and aforementioned second supply/discharge port.

In addition, a processing method of the invention is a processing method to process workpieces using a processing chamber provided with a first supply/discharge port and a second supply/discharge port, which are each used to load unprocessed workpieces and unload processed workpieces, that combines an operation to load unprocessed workpieces to the aforementioned processing chamber from the aforementioned first supply/discharge port, and unload processed workpieces in said processing chamber from the aforementioned second supply/discharge port, an operation to load unprocessed workpieces from the aforementioned second supply/entry port to the aforementioned processing chamber, and unload processed workpieces in said processing chamber from the aforementioned first supply/discharge port, and an operation to process workpieces in the aforementioned processing chamber, and alternately performs said operations to process workpieces.

ADVANTAGES OF THE INVENTION

A processor and processing method of the invention, through use of a method to enable efficient transport of workpieces, and alternately transport workpieces to the processing chamber from the first supply/discharge port and second supply/discharge port, can provide additional time for each port to supply workpieces, and facilitate the supply and processing of workpieces even during processing wherein the processing time of the processing chamber is short.

BRIEF DESCRIPTION OF DRAWINGS

FIG. 10 B is a side view of a tray.

PREFERRED EMBODIMENTS OF THE INVENTION

Figure 1:
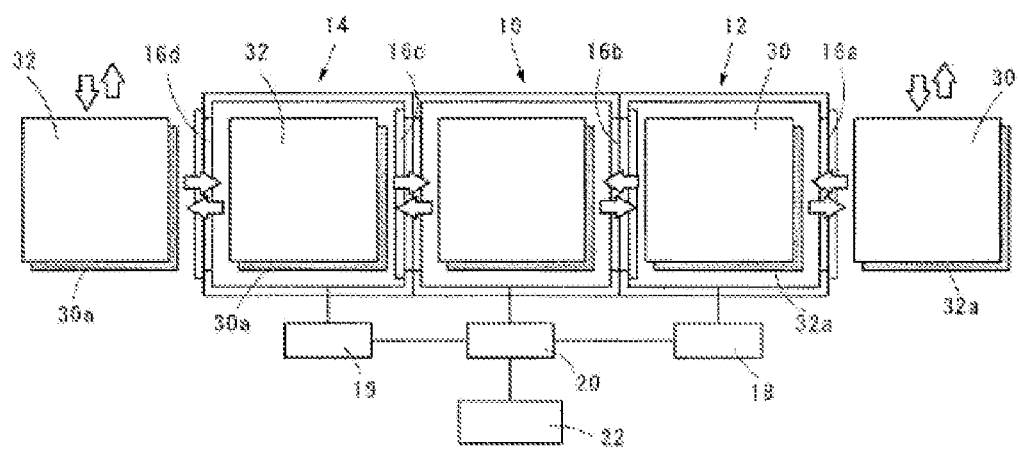
FIG. 1: Explanatory drawing showing the overall constitution of a processor of the invention.

Below, we will explain preferred embodiments of the invention in detail according to appended drawings.
Overall Constitution of Processor and Operation Thereof FIG. 1 shows the overall constitution of a processor of the invention. This processor has a first load lock chamber and a second load lock chamber disposed at positions on both sides of a processing chamber 10 with the processing chamber interposed in between, and the processing chamber disposed in a series of said chambers.

Respective gate valves 16a, 16b, 16c and 16d are provided on the edges of a first load lock chamber 12, a partition between the first load lock chamber 12 and a processing chamber 10, a partition between the processing chamber 10 and a second load lock chamber 14, and the edge of a second load lock chamber 14.

Respective vacuum devices 18, 19 are attached to the first load lock chamber 12 and second load lock chamber 14 for vacuum pump and air release operations. A processing control unit 20 is attached to the processing chamber 10 to control the supply of gas for film-forming, film-forming itself and other processes. However, the processing by the processing chamber 10 is not limited to film-forming processes. In addition, a control unit 22 is attached to control the overall processing device, including workpiece transport control, gate valve 16a-16d opening/closing control, vacuum device 18, 19 driving control and processing control unit 20 control. FIG. 1 shows the transport of a characteristic workpiece with a processing device of the invention. First, we will explain the processing method for a workpiece of the invention based on FIG. 1.

The characteristic constitution of a processing device of the invention involves both one end and another end of the processing device being workpiece loading ports and workpiece unloading ports, in other words, two workpiece supply/discharge ports consisting of a first supply/discharge port and a second supply/discharge port are provided on the processing chamber 10, wherein both this first supply/discharge port and the second supply/discharge port are used to load and unload workpieces. That is, after a workpiece loaded from the first supply/discharge port into the processing chamber 10 has been processed in the processing chamber, it is unloaded from the second supply/discharge port, or conversely, a workpiece loaded from the second supply/discharge port into the processing chamber 10 is unloaded from the first supply/discharge port after processing.

In FIG. 1, on one end of the processor, that is, the first load lock chamber 12 side, first an unprocessed workpiece 30 is loaded into the first load lock chamber 12, and then after being vacuum pumped by the first load lock chamber 12, is loaded into the processing chamber 10, and undergoes the required process inside the processing chamber 10. The processed workpiece 30 is loaded into the second load lock chamber 14, and then is unloaded from the processor by air release.

On one hand, on the other side of the processor, that is the second load lock chamber 14 side, unprocessed workpieces 32 are loaded into the second load lock chamber 14, are loaded into the processing chamber 10 from the second load lock chamber 14, and then undergo the required process. Processed workpiece 32a are loaded into the first load lock chamber 12, and then are unloaded from the processor by air release. Furthermore, although in the explanation of workpiece action, workpieces 30 were supplied from one side of the processor, and workpieces 32 were supplied from the other side, the workpieces 30, 32 are the same product.

With this device, unprocessed workpieces 30, 32 are loaded and processed from one side and the other side of a processor. A characteristic point is that in the operation to deliver workpieces between the processing chamber 10 and the first load lock chamber 12, and between the processing chamber 10 and the second load lock chamber 14, two workpieces may be exchanged at one time.

That is, the operation to load unprocessed workpieces 30 into the processing chamber 10, and the operation to unload processed workpieces 32a from the processing chamber 10 to the first load lock chamber 12, between the first load lock chamber 12 and the processing chamber 10, may be considered a single step.

This is the same between the second load lock chamber 14 and the processing chamber 10. The operation to unload processed workpieces 30a from the processing chamber 10 to the second load lock chamber 14, and the operation to load unprocessed workpieces 32 from the second load lock chamber 14 to the processing chamber 10, are performed by a one step operation.

An operation that switches (exchanges) and transports unprocessed workpieces 30, 32 and processed workpieces 32a, 30a specifically provides top and bottom bi-level support shelves on carriers to transport workpieces that are constituted to support individual workpieces on top and bottom support shelves, and enables the setting of unprocessed workpieces 30, 32 and processed workpieces 32a, 30a into separate respective support shelves. Below we will explain the specific constitution of the carrier.

When the operation to load workpieces 30 from the first load lock chamber 12 into the processing chamber 10 has been completed, processed workpieces 32a are transported to the first load lock chamber 12, and therefore after the gate valve 16b has been closed and the first load lock chamber 12 has been air released, processed workpieces 32a are unloaded from the first load lock chamber 12. After a processed workpiece 32a has been transported, the next unprocessed workpiece 30 is placed on the carrier, and then the operation to supply the next workpiece takes place. As with the second load lock chamber 14, by performing an operation to load unprocessed workpieces into the processing chamber 10, and unload processed workpieces 30a, processed workpieces 30a are left in the second load lock chamber 14, and therefore the gate valve 16c is closed, and processed workpieces 30a are unloaded from the second load lock chamber 14 by air release of the second load lock chamber 14. Next, the next unprocessed workpiece 32 is supported by the carrier, and the operation to supply the next workpiece takes place.

In this manner, unprocessed workpieces 30 are loaded into a processor from one side of the processor, and processed workpieces 30a pass through the processor and are unloaded from the other side, and, in addition, unprocessed workpieces 32 from the other side of the processor are loaded into the processor, pass through the processor, and then processed workpieces 32a are unloaded from the other side.

In this processing operation, workpieces 30, 32 are processed by alternately performing the operation to supply unprocessed workpieces 30 from the first load lock chamber 12 to the processing chamber 10, and the operation to supply unprocessed workpieces 32 from the second load lock chamber 14 to the processing chamber 10, so when one supply side of the processor is observed, workpieces may be supplied once per every two processing's by the processing chamber 10. That is, in comparison to conventional methods wherein workpieces are supplied per each processing operation of the processing chamber 10, the time to supply and prepare workpieces is doubled.

A processing method of this embodiment, even if the processing time of the processing chamber 10 is short, can provide additional time to supply workpieces, avoid the talk time of the processor being restricted by the time required to supply workpieces, and enable production processing with efficient operation of the processing chamber 10.

Constitution of Processor

Figure 2:
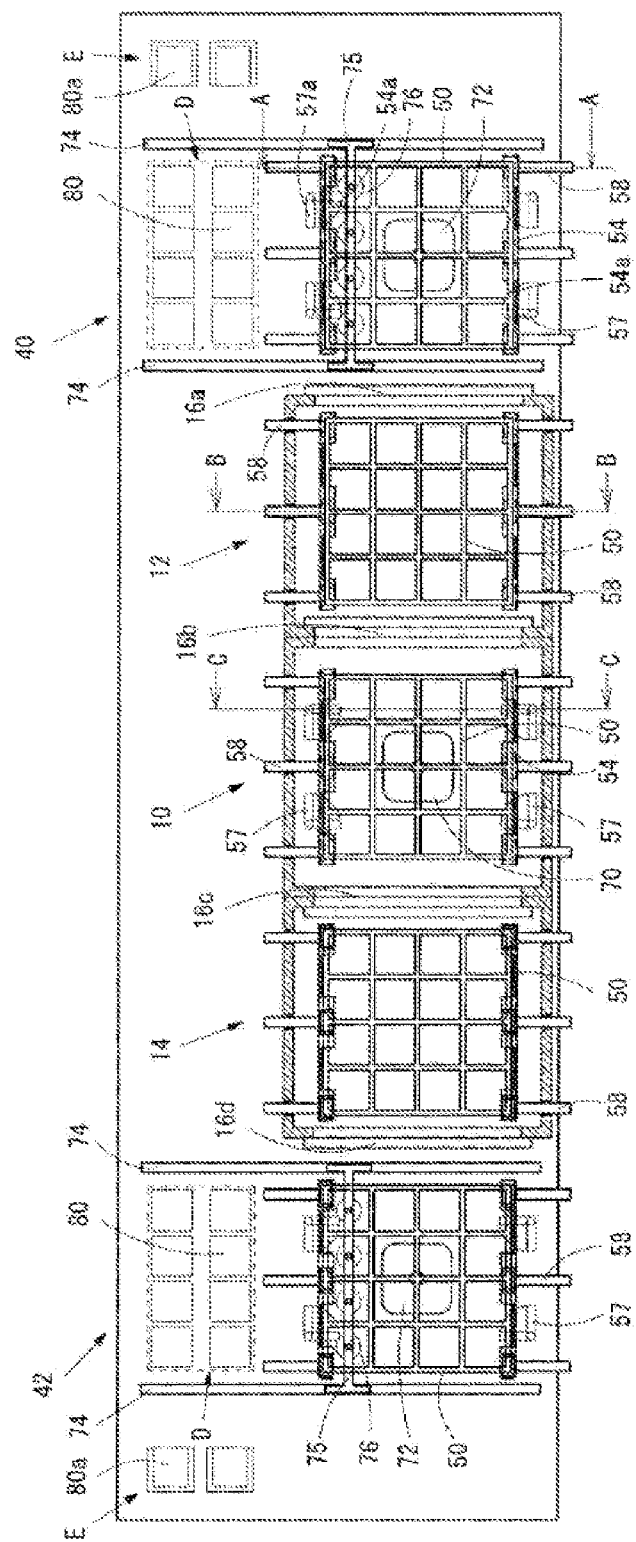
FIG. 2: A plane view showing an example constitution of a process of the invention.

FIG. 2 shows the constitution of a device for forming a reflection preventing film on the surface of a solar battery panel as an example of a processor of the invention.

A processor of this embodiment is constituted as in the embodiment described above, with a first load lock chamber 12 and a second load lock chamber 14 disposed in series at positions wherein the processing chamber 10 is interposed between them, and a first port 40 and a second port 42 disposed adjacent to the first load lock chamber 12 and second load lock chamber 14 respectively.

The first load lock chamber 12 and second load lock chamber 14, by closing the gat valves 16a-16d, form a sealed space cut off from the outside. Respective vacuum devices (not shown) are connected to the first load lock chamber 12 and the second load lock chamber 14.

In this processor, workpieces 80 are supported by trays 50, wherein the workpieces 80 are transported together with the trays 50 to the processing chamber 10 to undergo the required process.

FIG. 2 shows the movement of trays 50 to the first load lock chamber 12, second load lock chamber 14, processing chamber 10 and the first and second ports 40, 42, as explained. The trays 50 are formed as grates wherein 16 workpieces 80 are supported in 4×4 arrangements.

Furthermore, single large workpieces may be transported by themselves without using trays.

One characteristic constitution of the processor in this embodiment involves the carriers 54 for transporting trays 50 being made to support trays 50 at vertically separated positions consisting of a top position and bottom position.

Figure 3:
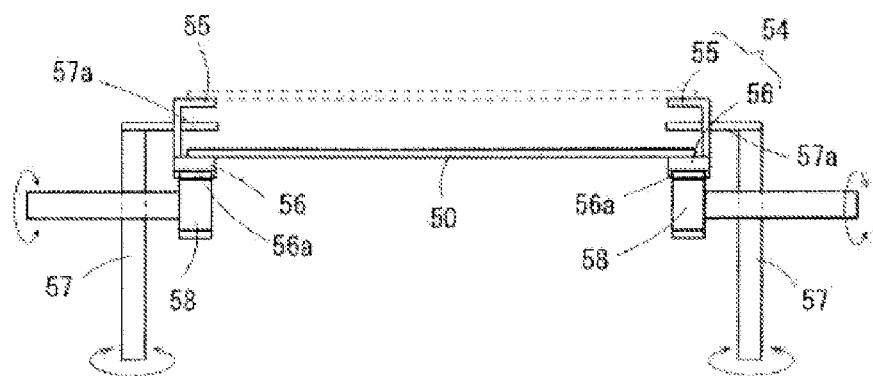
FIG. 3: A cross section along line A-A in FIG. 2 showing the constitution of a carrier supporting a tray.

FIG. 3 shows the constitution of a carrier 54 to support trays 50 in the first port 40 viewed along the cross section A-A. The carrier 54 is formed with its sides forming a u-shaped bar with a length roughly equal to the front to back width of a tray 50. Top shelves 55 and bottom shelves 56 are provided on the carrier 54 as support shelves to support the parallel edges on both sides in the transport direction of the tray 50. They are provided so that when the top shelves 55 and bottom shelves are each supporting trays 50, they maintain a vertical space between them so that the trays 50 do not clash with one another.

The workpieces move supported by the trays 50 and together with the carriers 54 to the first load lock chamber 12, processing chamber 10 and second load lock chamber. Consequently, by establishing a narrow space between the top shelves 55 and bottom shelves 56, it is possible to reduce the internal volume of the first and second load lock chambers 12, 14, and shorten the preparation time for transport by shortening the time required for vacuum pumping and other operations.

The carriers 54 have a rack and pinion structure, and as a result are supported to reciprocate in the loading and unloading direction while maintaining a horizontal height position. On the underside of the bottom shelves 56 of the carriers 54, racks 56a are formed across the entire length of the side edge of the carriers 54, and pinions that engage the racks are disposed under the carriers 54. The rack and pinion structure is suitable for stably transporting the horizontal height position of the carriers 54, and has the benefit of enabling accurate positioning of the transport position. However, the mechanism for transporter the carriers 54 is not limited to a rack and pinion structure.

As shown in FIG. 2, the pinions 58 are disposed to support the carriers 54 in the processor at equal intervals in the transport direction of the carriers 54, specifically at three positions on the side edge of the carriers 54. Throughout the entire processor, the pinions 58 are disposed at the same height positions, and when the pinions 58 engage with the racks 56a on the carriers 54, the carriers move while being delivered between each chamber. A rotation driving mechanism (not shown) is connected to the pinions 58, where each pinion rotation driving mechanism is controlled, and the transport of the carriers 54 is controlled.

In FIG. 3, lifting/lowering rods 57 are disposed on the sides of a carrier 54, constituting a support means to support trays 50. Hooks 57a to engage the underside of trays 50 are provided on the top edges of the lifting/lowering rods 57. Turning means (not shown) to turn them around the axial lines of the lifting/lowering rods 57 are attached to the lifting/lowering rods 57 between the positions at which the hooks 57a turn towards the inside of the trays 50, and the positions at which they turn away from the sides of the trays 50 so as not to engage the trays 50.

FIG. 3 shows the lifting/lowering rods 57 having lowered to their bottom positions, and the hooks 57a turned to the inside of the tray 50, with the hooks 57a at a height position between the top shelves 55 and the bottom shelves 56 of the carrier 54. The carrier 54 has incisions 54a provided, so that the carrier 54 and hooks 57a do not clash when the hooks 57a have turned, and also so that the carrier 54 and hooks 57a do not clash when the hooks 57a have lifted to the top position above the top shelves 55.

FIG. 3 shows a tray 50 supported by the bottom shelves 56 of a carrier 54. The supporting of the tray 50 by these bottom shelves 56 corresponds to unprocessed workpieces 80 being set into the tray 50, and workpieces 80 being transported to the first load lock chamber 12 with the tray 50 supported by the carrier 54.

In addition, in FIG. 3, the supporting of a tray 50 by the top shelves 55 of the carrier 54 corresponds to processed workpieces 80a being supported by the tray 50.

That is, the bottom shelves 56 of the carrier 54 are at the unprocessed workpiece 80 supply position, and the top shelves 55 of the carrier 54 are at the processed workpiece 80a unloading position.

Figure 4:
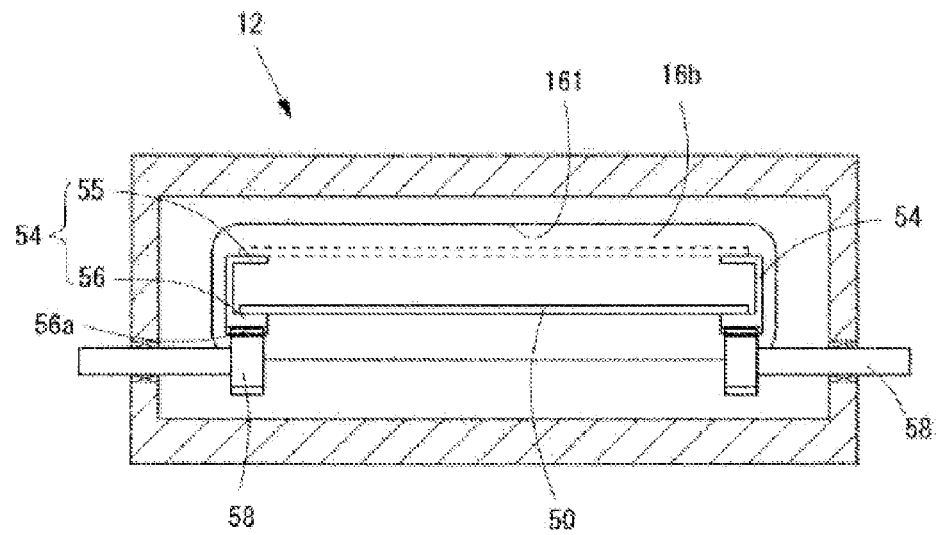
FIG. 4: A cross section along line 2-2 in FIG. 2 showing the positional relationship of the carrier and pinion

FIG. 4 is a side view showing the positional relationship of a carrier 54 and pinions 58 at the B-B line position in FIG. 2. In the drawing, a tray 50 supporting a workpiece 80 has been transported together with a carrier 54. The carrier 54 has been loaded horizontally into the first load lock chamber 12 and is supported meshing with the pinions 58, followed by the pinions 58 being rotationally-driven. The first load lock chamber 12 is vacuum pumped when an unprocessed workpiece 80 has been loaded, and is air released when a processed workpiece 80a has been unloaded from the processing chamber. The processed workpiece 80a is supported by the top shelves 55 of the carrier 54. An opening 161 that is stopped by a gate valve 16b is provided on the side of the first load lock chamber 12.

Figure 5:
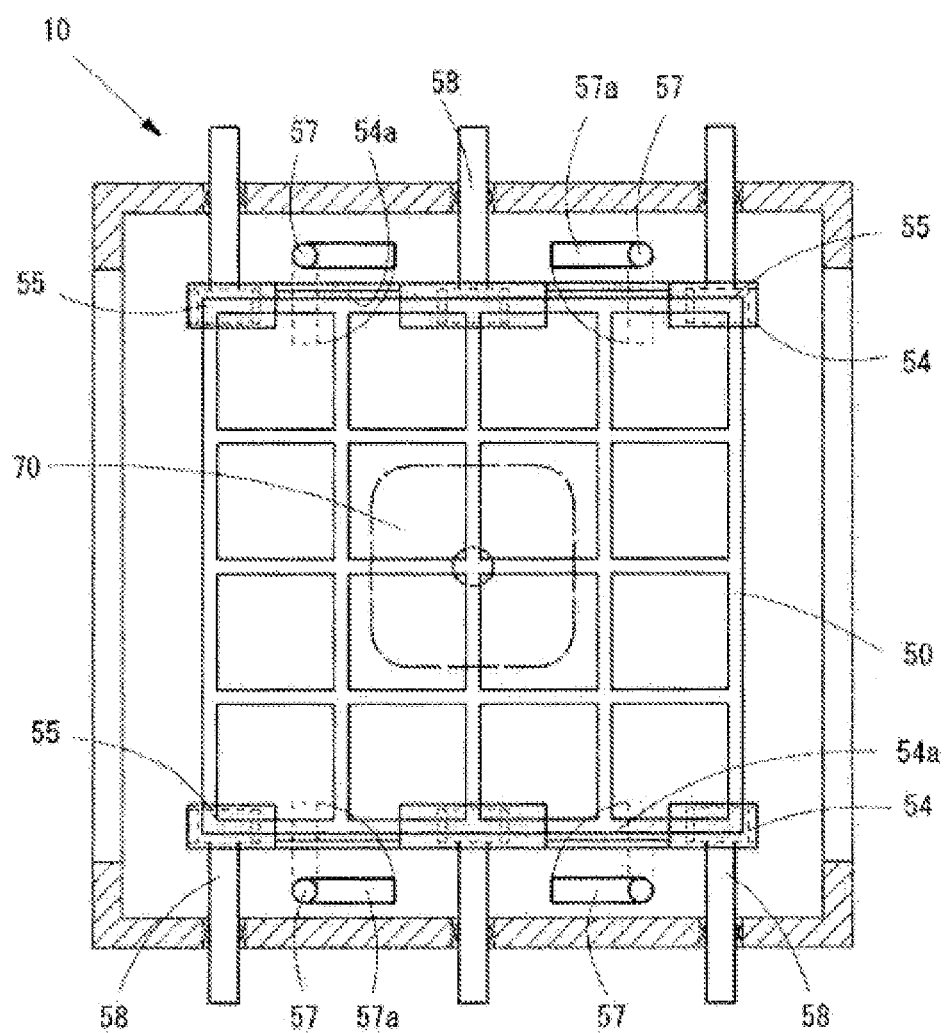
FIG. 5: A plane view of a carrier loaded into the processing chamber.

FIG. 5 is a plane view of a carrier 54 supporting a tray 50 loaded into a processing chamber 10. Both parallel edges are supported by the carrier 54 in the transport direction of the tray 50, while the carrier 54 is supported from below by the pinions 58. Incisions 54a are provided on the carrier 54, and hooks 57a provided on lifting/lowering rods 57 are capable of freely rotating between an avoidance position located on the outside of the carrier 54 and a latching position when rotated to the inside of the carrier 54, and are capable of moving to a top position above the top shelves 55.

Furthermore, the carrier 54, after moving to the processing chamber 10 from the first load lock chamber 12, moves back to the first load lock chamber 12 together with a tray supporting a processed workpiece 80a. A lifting/lowering stage 70 disposed in the middle of the processing chamber 10 is provided so that it can be lifted and lowered between a bottom position and a top position.

Figure 6:
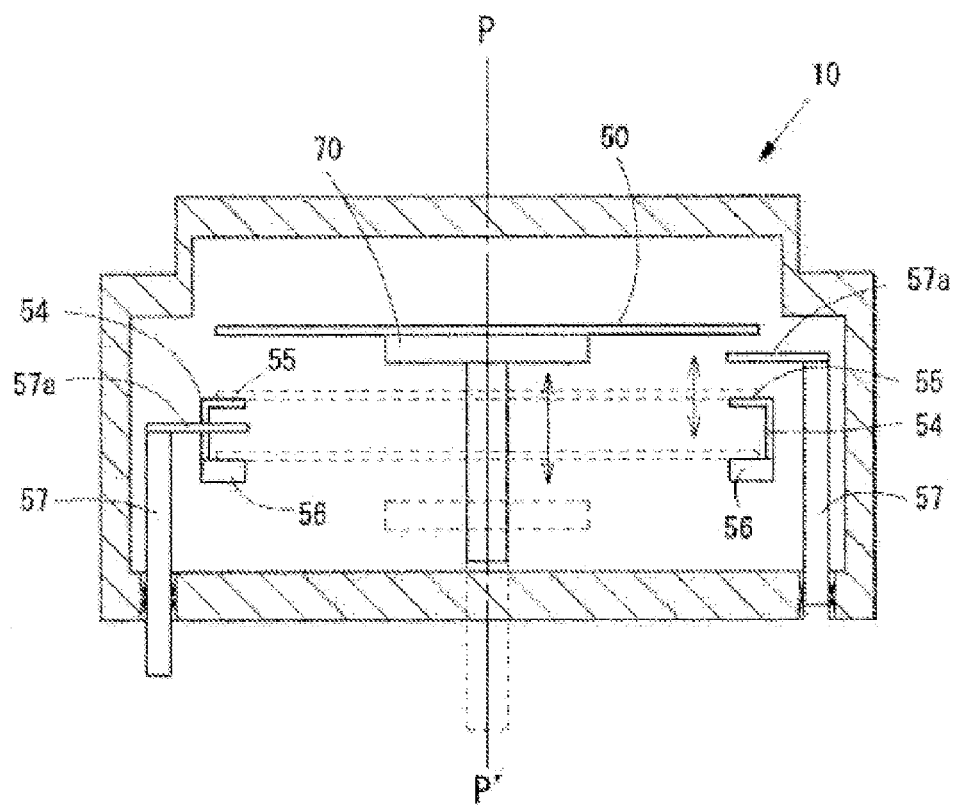
FIG. 6: A side view at line C-C in FIG. 2 showing the positional relationship of a carrier, lifting/lowering rods, a tray and a lifting/lowering stage.

FIG. 6 is a side view showing the positional relationship of the carrier 54, lifting/lowering rods, tray 50 and the lifting/lowering stage 70, at line C-C in FIG. 2. The lifting/lowering stage 70 constitutes a moving means to raise and support a tray 50 that has been transported by the carrier 54 from the bottom shelves 56 to a top position wherein film-forming is performed.

The lifting/lower rods 57 constitute a transfer means that receives the tray 50 processed at the top position from the lifting/lowering stage 70 slightly above the top shelves 55 of the carrier 54, and then next sets it in the top shelves 55 of the carrier 54.

In the aforementioned explanation, we explained the first port 40 and first load lock chamber 12 positioned on one side of the processor shown in FIG. 2, but the constitution of the second port 42 and second load lock chamber 14 disposed on the other side of the processor is exactly the same as the constitution of the first port 40 and first lock load chamber 12.

Lifting/lowering stages 72 to lift and lower the tray 50 are disposed in the first and second ports 40, 42. These lifting/lower stages 72 are driven to lift and lower between an intermediate position between the top shelves 55 and bottom shelves 56 of the carriers 54, and a bottom position lower than the carriers 54.

In addition, in the first and second ports 40, 42, guide rails 74 extending in a direction perpendicular to the transport direction of the carriers 54 are disposed, and moving frames 75 that move forward and backward along the guide rails 74 are provided. Adsorption pads 76 to adsorb and support workpieces 80 are provided on the moving frames 75 corresponding to the number of rows disposed and the disposed positions of workpieces 80 on the trays 50. The adsorption pads 76 are connected by an air adsorption device (not shown).

On the sides of the guide rails 74, aligned with the disposed positions of the workpieces 80, a workpiece supply unit D wherein unprocessed workpieces 80 are arrayed and housed, and a housing unit E that houses processed workpieces 80, are disposed.

Processor Operation

Next, we will explain the operation of processing workpieces 80 by a processor of this embodiment referring mainly to FIG. 2.

The operation first begins with a tray 50 wherein unprocessed workpieces 80 have been set supported by the bottom shelves 56 of a carrier 54 in the first port 40 (FIG. 3). The top shelves 55 of the carrier 54 are empty.

The gate valve 16a is opened, and the tray 50 is loaded together with the carrier 54 to the first load lock chamber 12 while the gate valve 16b remains closed. This loading operation is carried out by the rack and pinion mechanism described above.

After the carrier 54 supporting the tray 50 has been loaded into the first load lock chamber 12, the gate valve 16a is closed, and the first load lock chamber is vacuum pumped.

When the first load lock chamber 12 reaches a prescribed vacuum level, and the process in the processing chamber 10 has ended, the gate valve 16 is opened to load the tray 50, wherein workpieces 80 have been set, together with the carrier 54, into the processing chamber 10.

In the processing chamber 10, after the film-forming process has been performed with the tray 50 supported in the top position by the lifting/lowering stage 70, which is a moving means, and the film-forming process has been completed, the lifting/rising stage 70 is lowered, at which time, the tray 50 is delivered from the lifting-lowering stage 70 to the lifting-loading rods 57, which are a moving means. As shown on the right of the centerline (line P-P') shown in FIG. 6, the tray 50 is delivered with the hooks 57a of the lifting/lowering rods 57 at a position higher than the top shelves 55 of the carrier 54, and the placement of the carrier 54 is maintained. The lifting/lowering stage 70 is lowered to a position lower than the carrier 54.

After the film-forming processing in the processing chamber 10, the placement of a tray 50 together with a carrier 54 from the first load lock chamber 12 into the processing chamber 10, according to FIG. 6, involves the tray 50, wherein unfinished workpieces 80 are set, supported by the bottom shelves 56 of the carrier 54, and the tray 50, wherein processed workpieces 80a are supported, supported by the lifting/lowering rods 57 above the carrier 54.

The lifting/lowering rods 57 are lowered from this state, and then the tray 50, wherein processed workpieces 80a have been set, is delivered from the lifting/loading rods 57 to the top shelves 55 of the carrier 54. The lifting/lower rods 57, after being lowered to the bottom position, are rotated so that the hooks 57a are facing outwards so the hooks 57a and carrier 54 do not clash with one another when the carrier 54 moves.

Simultaneously, the lifting/lowering stage 70, which is at the bottom position of the carrier 54, elevates, the tray 50 supported by the bottom shelves 56 is carried to an intermediate position between the bottom shelves 56 and the top shelves 55, and then stops at that position.

While in this state, the carrier 54 is moved from the processing chamber 10 to the first load lock chamber 12. When this return movement operation occurs, the tray 50 wherein processed workpieces 80*a* are set, is supported by the top shelves 55 of the carrier 54, while the tray 50 wherein unprocessed workpieces 80 are set comes out from the bottom shelves 56, and then the bottom shelves 56 are in the empty position.

In the processing chamber 10, the tray 50 is carried from being supported at the intermediate position by the lifting/lowering stage 70 to the top position wherein the film-forming process is performed, and then the required film-forming process is performed at the top position.

With this processor, the supply operation that follows the operation of a tray 50, wherein unprocessed workpieces 80 have been set, being supplied from the first load lock chamber 12 to the processing chamber 10, is performed by a tray 50, wherein unprocessed workpieces 80 have been set, being supplied from the second load lock chamber 14.

The operation by which a tray 50, wherein unprocessed workpieces 80 have been set, is newly supplied from the second load lock chamber 14 to the processing chamber 10, and then a tray 50, wherein processed workpieces 80*a* have been set, is supplied to the carrier 54, is exactly the same as the method described above. In this case, a tray 50 unloaded from the processing chamber 10 to the second load lock chamber 14 is a tray 50 for supporting workpieces 80*a* that have been supplied from the first load lock chamber 12 to the processing chamber 10 and processed by the previous operation.

That is, a tray 50, wherein workpieces 80 supplied from the first load lock chamber 12 have been set, goes through the processing operation in the processing chamber 10 and is unloaded to the second load lock chamber, and then a tray 50, wherein workpieces 80 supplied from the second load lock chamber 14 to the processing chamber 10 have been set, is unloaded to the first load lock chamber 12 after processing.

After the gate valve 16*b* has been closed, the first load lock chamber 12 is air released, and then the tray 50, wherein processed workpieces 80*a* carried to the first load lock chamber 12 have been set, is unloaded from the first load lock chamber 12 to the first port 40.

In the first port 40, an operation is performed to preset unprocessed workpieces 80 in a tray 50 separate from the tray 50 being unloaded from the first load lock chamber. This operation is performed by supplying workpieces 80 to the tray 50 four times per row from the supply unit D for workpieces 80, while the tray 50 is supported by the lifting/lowering stage 72, which is a setting means. Workpieces 80 are transferred by moving the moving frame 75 along the guide rails 74 between the tray 50 tops, and adsorption and support by the adsorption pads 76.

When a tray 50 is unloaded from the first load lock chamber 12 to the first port 40 together with a carrier 54, a tray 50 wherein unprocessed workpieces 80 to be supplied have been set, is supported at an intermediate height between the top shelves 55 and bottom shelves 56 of the carrier 54 by the lifting/lowering stage 72. Consequently, the tray 50, wherein unprocessed workpieces 80 have been set, is placed between the top shelves 55 and bottom shelves 56 of the carrier 54 by an operation wherein the carrier 54 moves to the first port 40. While in this state, the lifting/lowering stage 72 is moved to the bottom position, and a new tray 50 is delivered from the lifting/lowering stage 72 to the bottom shelves 56 of the carrier 54.

On the other hand, regarding a tray 50, wherein processed workpieces 80 supported by the top shelves 55 of the carrier 54 have been unloaded to the first port 40, when the carrier 54 has moved sideways on the guide rails 74, the hooks 57*a* of the lifting/lowering rods 57 are placed into an intermediate position between the top shelves 55 and bottom shelves 56, and the lifting/lowering rods 57 are lifted and the tray 50 is supported at an above position separated from the carrier 54.

Since the tray 50 is supported on the carrier 54 only by the bottom shelves 56 by this operation, while in this state, the tray 50 is loaded together with the carrier 54 into the first load lock chamber 12. Action after the tray 50 has been loaded into the first load lock chamber is as described above.

Since processed workpieces 80*a* are set into the tray supported by the lifting/lowering rods 57, the lifting/lowering rods 57 are lowered to the transfer position for the workpieces 80*a*, and then the tray 50 is delivered from the lifting/lowering rods 57 to the lifting/lowering stage 72. While in this state, the moving frame 75 is reciprocated on the guide rails 74, and the processed workpieces 80*a* are transferred from the tray 50 to the housing unit E. After processed workpieces 80*a* have been transferred from the tray 50 to the supply unit E, next, unprocessed workpieces 80 are transferred from the supply unit D for workpieces 80 to the tray 50.

The height of the tray 50 when transferring unprocessed workpieces 80 and processed workpieces 80*a* between the tray 50 and supply unit D, and the housing unit E, is established at an intermediate position between the top shelves 55 and bottom shelves 56 of the carrier 54, and after the workpieces 80 have been transferred to the tray 50, the tray 50 is inserted between the top shelves 55 and bottom shelves 56 of the carrier 54, by the carrier 54 being unloaded from the first load lock chamber 12.

The operation by which this tray 50 switches between unprocessed workpieces 80 and processed workpieces 80*a* may be performed while the tray 50 is moving to the processing chamber 10 and returning to the first port 40.

The transfer operation for workpieces 80, 80*a* in the second port 2 is also exactly the same as the transfer operation in the first port.

That is, the operation wherein a carrier 54 is unloaded to the second port 42, allows a new tray 5, wherein unprocessed workpieces 80 have been set, to be delivered to the bottom shelves 56 of the carrier 54, to be transported to the second lock load chamber 14, processed workpieces 80*a* to be transferred from the remaining tray 50 supported by the lifting/lowering rods 57 in the second port 42 to the housing unit E, followed by unprocessed workpieces 80 being transferred from the supply unit D to a tray 50, in preparation of subsequent supply operation.

Timing Chart

Figure 7:
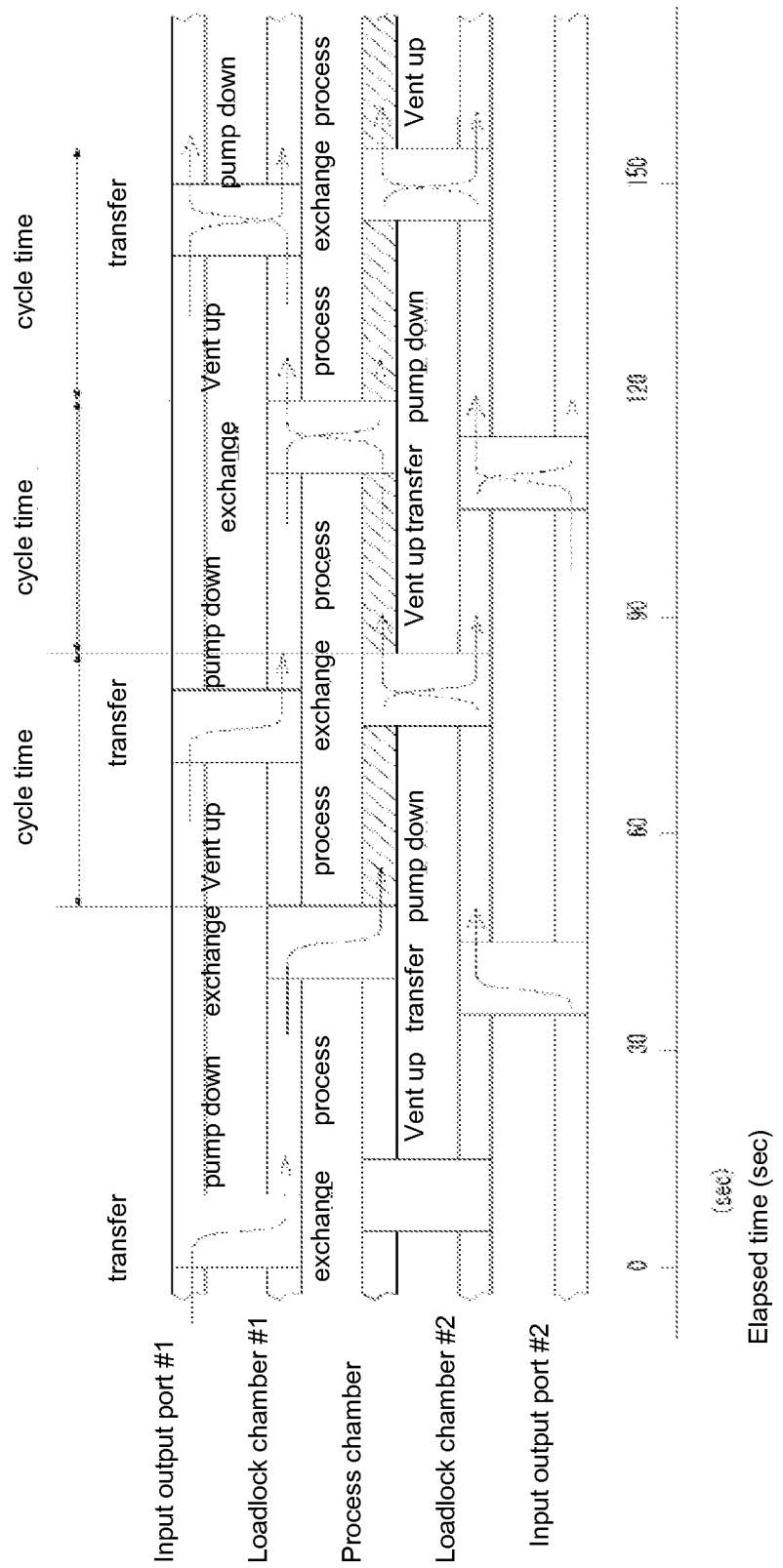
FIG. 7: A timing chart showing the operation of a processor.

FIG. 7 shows a trimming chart of the operation of a processor of this embodiment. The drawing shows the operation from the point that the loading of workpieces from the first port 40 and second port 42 has started. The bold arrow indicates workpieces supplied from the first port 40, while the dotted arrow indicates workpieces supplied from the second port 42.

First, workpieces are loaded from the first port 40 into the first load lock chamber 12, and then after the first load lock chamber 12 has been vacuum pumped, they are loaded into the processing chamber 10, and processing starts.

On the other hand, workpieces are loaded into the second load lock chamber 14 from the second port 42 with a slight timing delay, the second load lock chamber 14 is vacuum pumped, and workpiece transport from the second load lock chamber 14 to the processing chamber 10 is prepared.

When workpiece processing in the processing chamber 10 has ended, the processed workpieces are exchanged with workpieces supplied from the second load lock chamber. The intersection of the solid arrow and the dotted arrow indicates the operation by which processed workpieces are unloaded from the processing chamber 10, and unprocessed workpieces are carried to the processing chamber 10.

Workpieces supplied from the second load lock chamber 14 the start processing in the processing chamber 10.

On one hand, processed workpieces unloaded from the processing chamber 10 to the second load lock chamber 14 are housed in the second port 42 by the operation for switching between the second load lock chamber 14 and the second load port 42. In addition, the next workpieces are prepared for loading in the second port 42 by this operation.

On the other hand, workpieces supplied from the previous second load lock chamber 14 to the processing chamber 10, after processing in the processing chamber 10, are exchanged with workpieces loaded from the first load lock chamber 12. By this exchange operation, workpieces loaded from the first load lock chamber 12 remain in the processing chamber 10, and the workpieces processed in the processing chamber are delivered to the first load lock chamber 12.

Workpieces delivered to the first load lock chamber 12 are housed in the first port 40 by the operation for switching between the first port 40 and the first load lock chamber 12. In addition, the next workpieces are prepared for loading in the first port 40 by this operation.

Thus, the supply timing for workpieces is offset by every half-cycle in the first port 40 and second port 42, workpieces are supplied sequentially, while simultaneously workpieces that have completed processing are delivered. As understood from FIG. 7, workpieces supplied from the first port 40 are unloaded to the second port 42, while conversely, workpieces supplied from the second port 42 are unloaded to the first port 40.

The timing chart example shown in the drawings assumes a processing time of 25 seconds inside of the processing chamber 10, and 10 seconds for the exchange operation. In this case, the cycle time of the processing chamber 10 is 35 seconds. In the case of conventional methods wherein workpieces are supplied from a single direction to the processor, the next workpieces must be prepared for supply every 35 seconds to maintain a 35 second cycle time for the processing chamber. On the other hand, in the case of a processor of this embodiment, the next workpieces may be prepared for supply every 70 seconds in the first port 40 and second port 42.

In this manner, by using the processor constitution in this embodiment, the time required to supply workpieces may be extended twofold, enabling effective use when the processing time (cycle time) in the processing chamber 10 is reduced, and the supply operation for workpieces exceeds the cycle time of the processing chamber 10. In cases such as film-forming a reflection preventing film on the surface of a solar battery panel of this embodiment, since the film thickness is a thin at about 0.8 μm, the time required for film-forming is about 20 to 50 seconds. In the case of such short-time processing, a processor constitution of the invention is considerably effective, and furthermore, very effective in raising production efficiency.

As described above, the constitution of the transport system used in a processor of this embodiment is simple, and useful from the standpoint of not requiring a complicated mechanism.

In addition, it is not limited solely to cases of short processing times for the processing chamber 10, but may be effectively used when manufacturing products within a short time relatively to the operation for supplying workpieces. By increasing the cycle time to supply workpieces, it becomes possible to ensure a stable workpiece supply, as well as enable highly reliable processing. In addition, it is possible to use vacuum devices of small capacity and low processing performance, as well as reduce manufacturing costs for the device.

Furthermore, the aforementioned embodiment showed one example of a processor, and various modifications of the specific constitution are possible. For example, in the aforementioned embodiment, the carriers 54 were formed into bars, but the carriers 54 may actually take various forms. In addition, the carriers 54 are constituted to transport using a rack and pinion mechanism, but they are not limited to this. In addition, appropriate selections may be made as to the form of the lifting/lowering rods 57 and lifting/lowering stage 70, and the supply and unloading mechanisms for workpieces 80 in the first port 40 and second port 42.

Other Constitutions of the Processor

Figure 8:
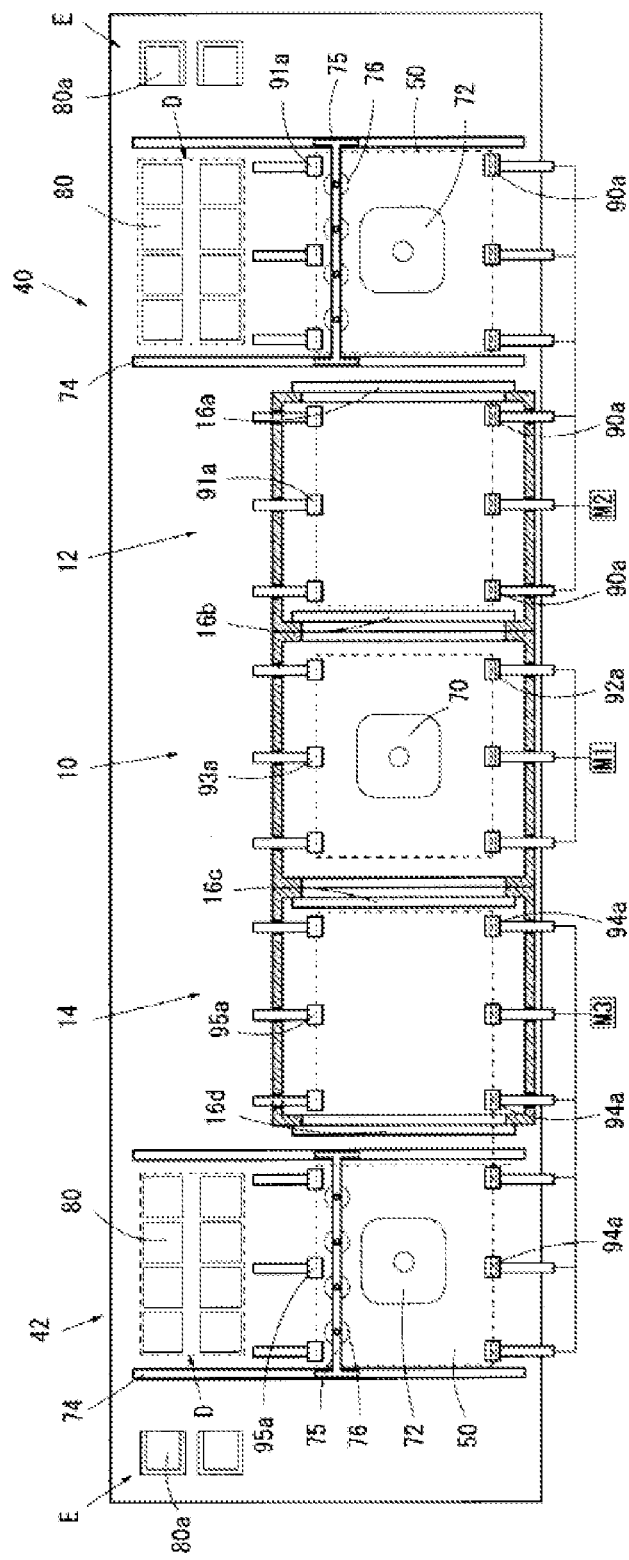
FIG. 8: A plane view showing an example of another constitution of a processor of the invention.

FIG. 8 shows another constitution example of the processor described above. A process of this embodiments, as with the previously described processor, is constituted with a first load lock chamber 12 and a second load lock chamber 14 disposed with a processing chamber 10 interposed between them. In addition, adjacent to the first load lock chamber 12 and the second load lock chamber 14, a first port 40 and second port 42 for entry and exit of workpieces 80 between the first load lock chamber 12 and second load lock chamber 14 are disposed. In the drawing, the constitution is the same as the previously described processor. For example, the gate valves 16a-16d and the lifting/lowering stages 70, 72 use the same reference numbers.

In a processor of this embodiment as well, the basic transport operation for the trays 50 when workpieces 80 are processed is the same as the transport operation for the trays 50 in the previously described processor. That is, unprocessed workpieces 80 loaded from the first supply/discharge port meant for the processing chamber 10, after being processed in the processing chamber 10, are unloaded from the second supply/discharge port of the processing chamber 10, while conversely, unprocessed workpieces 80 loaded from the second supply/discharge port into the processing chamber 10, after being processed in the processing chamber 10, are unloaded from the first supply/discharge port. That is, trays 50 supporting unprocessed workpieces 80, and trays 50 supporting processed workpieces 80, are carried in and out while being moved such that they intersect when passing through the processing chamber 10.

A characteristic constitution in a processor of this embodiment is that, while in the previously described processor (FIG. 2), trays 50 are being transported using the carriers 54, in this processor, transport rollers are vertically disposed on two levels as a transport mechanism for the trays 50, and unprocessed workpieces 80 and processed workpieces 80 are transported in intersecting directions and supplied without using carriers 54.

Figure 9:
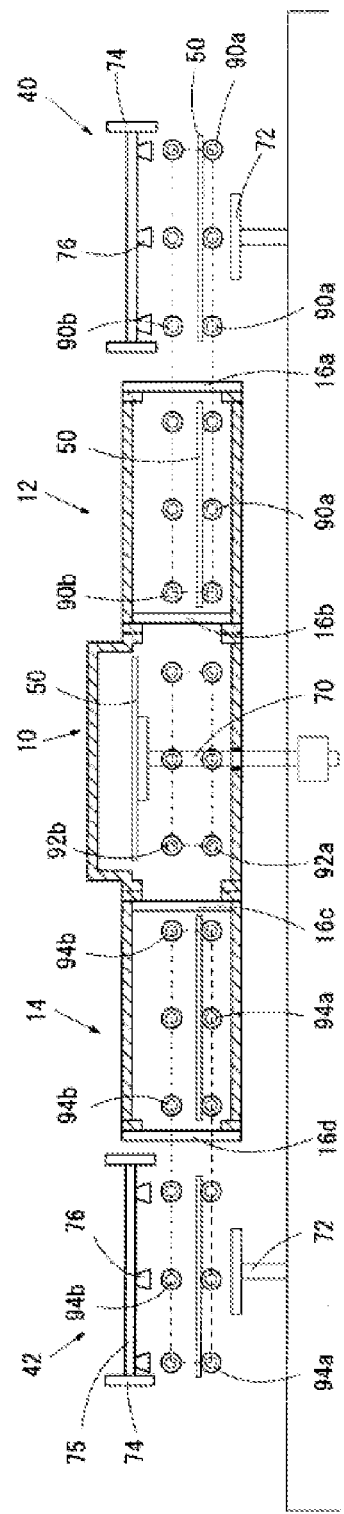
FIG. 9: A front view of an example of another constitution of the processor.

FIG. 9 shows a processor being viewed from the front. As in the drawing, the transport rollers 90a-94b are disposed on the top and bottom across the first port 40, first load lock chamber 12, processing chamber 10, second load lock chamber 14 and second port 42. In the drawing, of the top and bottom transport rollers, the transport rollers 90a, 90b, 92a, 92b, 94a and 94b on the forward side are seen.

The bottom transport rollers 90a, 92a and 94a, and the top transport rollers 90b, 92b and 94b have height positions set so that the transport height positions of both are horizontal. From among the top and bottom transport rollers, FIG. 8 shows the bottom transport rollers 90a, 91a, 92a, 93a, 94a and 95a. The transport rollers 91a, 93a and 95a are disposed on the document page side with gaps between them running along the width of the tray 50, opposite the transport rollers 90a, 92a and 94a on the page reader side. The top transport rollers 90b-95b are disposed in the same manner as bottom transport rollers 90a-95a.

The transport rollers 90a, 91a, 90b and 91b, which are disposed in the first port 40 and first load lock chamber 12, are rotationally driven in complete synchronization using an electric motor M2 as a driving unit for the transport rollers. In this embodiment, 12 bottom transport rollers 90a-91a each disposed in the first port 40 and first load lock chamber 12, and 24 transport rollers 90a-91b aligned with the 12 top transport rollers 90b-91b, are rotationally-driven in synchronization.

In the processing chamber, the six bottom transport rollers 92a-93a disposed in the processing chamber 10, and the 12 transport rollers aligned with the six top transport rollers 92b-93b (not shown) are rotationally-drive in synchronization by a single electric motor M1.

The bottom and top transport rollers 94a-95b disposed in the second port 42 and second lock load chamber 14 also constituted together 24 transport rollers that are rotationally-driven in synchronization by a single electric motor M3.

The electric motor M1 rotationally drives the transport rollers in one direction and another direction according to the transport direction of the trays 50.

To synchronize and rotate the forward side transport rollers 90a and backward side transport rollers 91a, a single forward side transport roller 90a and a single transport roller 91 opposingly disposed on the backward side are connected via a common drive shaft, while other transport rollers 90a, 91a may be coordinated via a common drive shaft and pulley.

To synchronize and rotate the bottom transport roller 90 and top transport roller 90b, a gear attached to the rotating shaft of the bottom transport roller 90a and a gear attached to the rotating shaft of the top transport roller 90b may be meshed and attached. Whereby, the bottom and top transport rollers 90a, 90b rotate in mutually opposite directions, and the transport direction (transport orientation) of the trays 50 is reversed by the bottom transport rollers 90a, 91a and the top transport rollers 90b, 91b. The other transport rollers 92a-95b are coordinated in the same manner.

In this embodiment, the processing chamber 10 is disposed in an interposed position, while the bottom transport rollers (90a, 91a, 92a, 93a) and the top transport rollers (90b, 91b, 92b, 93b) constitute a first transport mechanism, and the other bottom transport rollers (92a, 93a, 94a, 95a) and top transport rollers (92b, 93b, 94b, 95b) constitute a second transport mechanism. In addition, a control unit to control the electric motors M1, M2 and M3 for driving these transport rollers is provided.

Figure 10A:
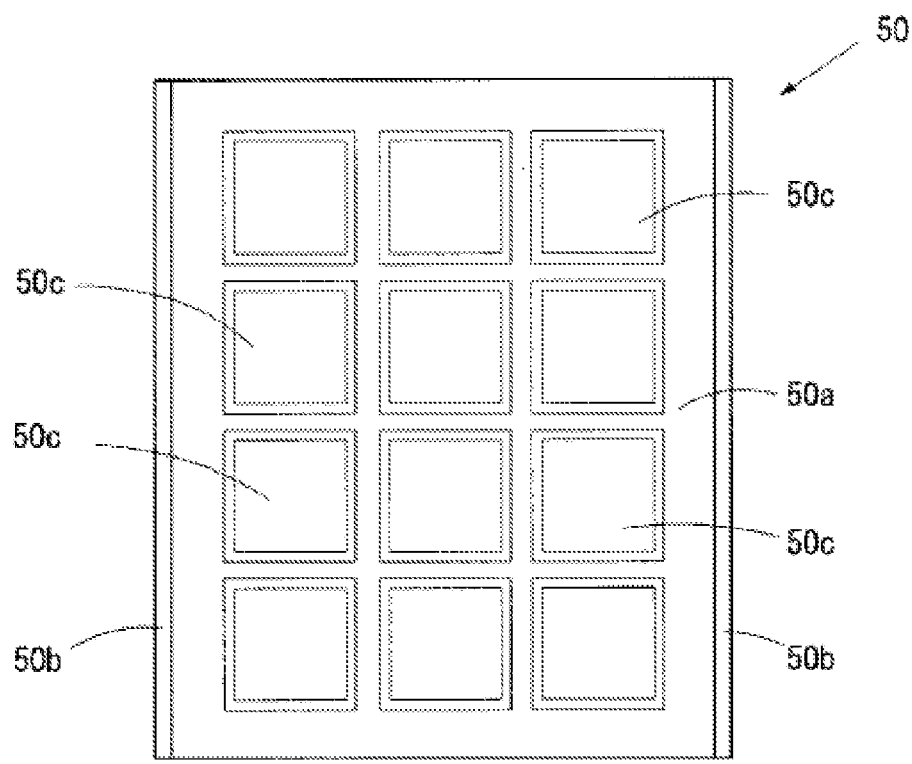
FIG. 10A is a plane view of a tray.
Figure 10B:
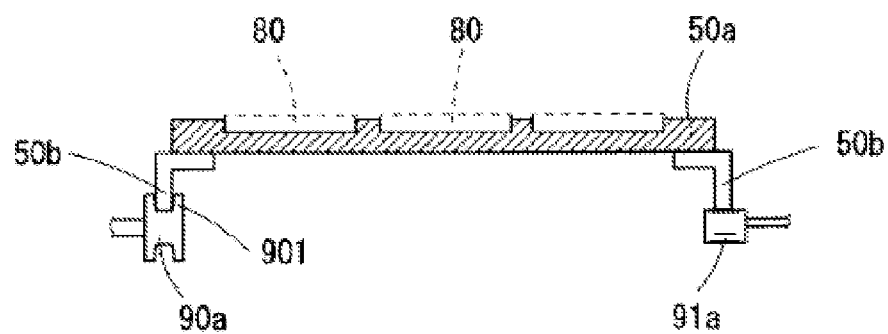
FIG. 10.

FIGS. 10A and B show an example of a tray 50 used by a processor of this embodiment. FIG. 10A is a plane view, while FIG. 10B is a view from a side direction (shows a cross section of a carbon tray 50a). The tray 50 consists of carbon tray 50a for setting workpieces 80, and guide rails 50b attached to both side edges of the carbon tray 50a. Setting depressions 50c for setting workpieces (solar battery panels, for example) 80 are provided on the carbon tray 50a.

As shown in FIG. 10B, a roller body providing flanges 901 is used for one transport roller 90a, and the bottom end of one guide rail 50b for the tray 50 is guided by these flanges 901, so that the transport direction of the tray 50 is regulated. No flanges are provided on the other transport roller 91a so as not to prevent the tray 50 from heating and thermally expanding during processing.

The structure and size of the trays 50 is established according to the workpieces 80. In cases in which simple large tabular workpieces have been formed, the workpieces may simply be transported supported by the rollers 90a, 91a without using trays 50. As for the other transport rollers 92a-95b, they are similarly constituted. Furthermore, the constitution of the transport rollers may involve the use of transport rollers with appropriate constitutions based on the size and form of the workpieces being transported.

Figure 11:
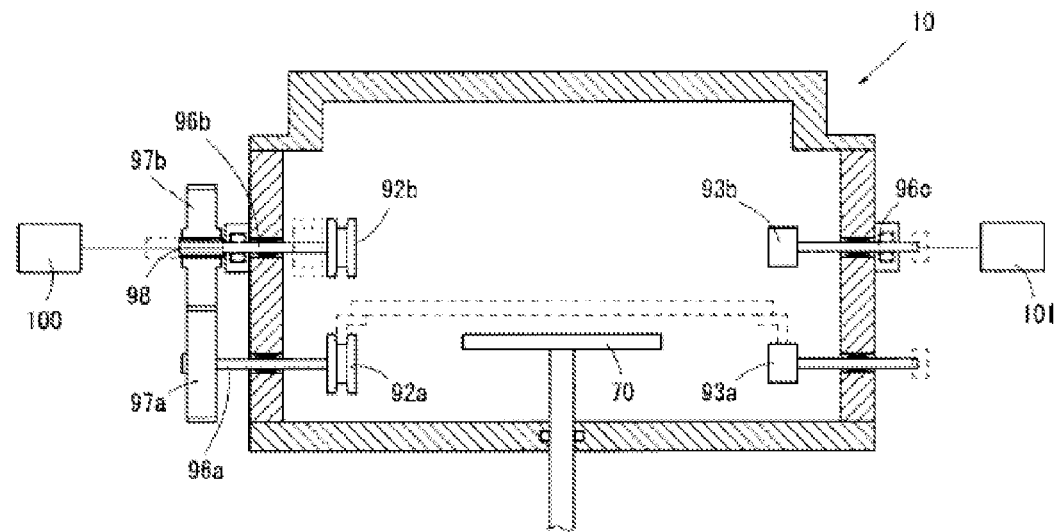
FIG. 11: A side view showing the constitution of the inside of a processing chamber.
Figure 12:
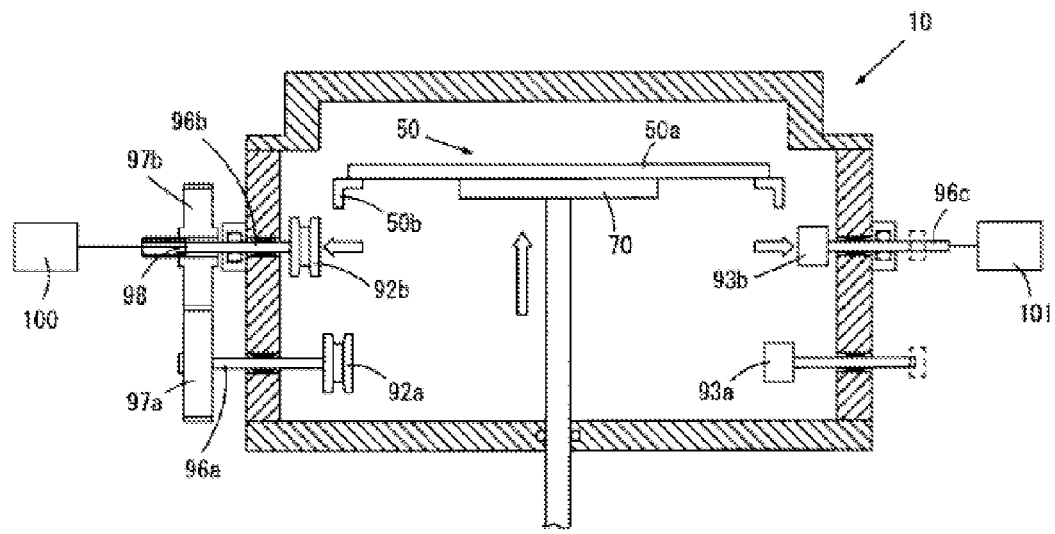
FIG. 12: A side view showing a tray that has been lifted to the processing position

FIG. 11 shows an example of attaching transport rollers 92a, 92b, 93a and 93b in a processing chamber 10. The bottom transport roller 92a and top transport roller 92b, as described previously, are coordinated by meshing gears 97a, 97b fixed to respective rotating shafts 96a, 96b.

In this embodiment, the transport rollers 92b, 93b disposed on the top of the processing chamber 10 are constituted so they may move widthwise of the trays 50 (direction perpendicular to the direction in which the tray 50 is being transported). O-rings or other seals are installed on the rotating shafts 96b, 96c of the transport rollers 92b, 93b, and the rotating shafts 96b, 96c can move axially while vacuum sealed to the partitions of the processing chamber 10.

The top gear 97b and rotating shaft 96b are provided so that the edge of the rotating shaft 96b is formed on a spline shaft 98, the gear 97b and spline shaft 98 are provided so that they can rotate in the axial direction of the rotating shaft 96b, and the rotating shaft 96b and gear 97b are provided so they integrally rotate circumferentially. Naturally, the method by which the rotating shaft 96b and gear 97b engage is not limited to the use of a spline shaft as long as they freely move axially and integrally rotate circumferentially.

The rotating shaft 96b connects with a drive unit 100 to push the rotating shaft 96b axially, and the rotating shaft 96c connects to the drive unit 101 to be pushed axially. The drive units 100, 101 constitute an avoidance means.

Furthermore, the top transport rollers 90b, 91b, 94b and 95b in the first port 40 and second port 42 are also constituted so that the transport rollers 90b, 91b, 94a and 95b move in a direction perpendicular to the transport direction of the trays, the same as shown in FIG. 11. These constitutions are also the same as the constitutions for the top transport rollers 92b, 93b shown in FIG. 11.

Operation of Processor

Next, we will explain the operation of processing workpieces 80 using a processor in this embodiment.

First, in the first port 40, a tray 50, wherein unprocessed workpieces 80 have been set, is set onto the bottom transport rollers 90a, 91a.

Next, the electric motor M2 is driven, and the tray 50 is loaded into the first load lock chamber 12. During normal operation, when a tray 50 is loaded into the first load lock chamber 12, a tray 50 supporting processed workpieces 80 is unloaded from the first load lock chamber 12 to the first port 40. That is, the operations to load and unload the trays 50 between the first load lock chamber 12 and first port 40 are performed synchronously.

As described previously, the bottom transport rollers 90a, 91a and top transport rollers 90b, 91b rotate in opposite directions, so by driving the transport rollers with the electric motor M2, the top and bottom trays 50 move in opposite directions, and the operations to load and unload trays 50 are performed.

After a tray 50 is loaded into the first load lock chamber, the gate valve 16a closes, and the first load lock chamber 12 is vacuum pumped. Thus, the unprocessed workpieces 80 may now be loaded into the processing chamber 10.

When the processing of the workpieces 80 loaded in the processing chamber 10 in the previous step is complete, the gate valve 16b is opened, the electric motor M1 and electric motor M2 are driven in synchronization, the tray (unprocessed workpieces) 50 is loaded onto the bottom transport rollers 92a, 93b of the processing chamber, and the tray (processed workpieces) 50 is delivered from the top transport rollers 92b, 93b of the processing chamber 10 to the top transport rollers 90b, 91b of the first load lock chamber 12.

When trays 50 have been delivered between the bottom and top transport rollers, the gate valve 16b is closed, the first load lock chamber 12 is air released, the electric motor M2 is driven, the trays (processed workpieces) 50 is unloaded from the first load lock chamber 12 to the first port 40, while simultaneously the tray (unprocessed workpieces) 50 is loaded from the first port 40 to the first load lock chamber 12. The tray 50 supporting processed workpieces 80 is unloaded by the top transport rollers 90b, 91b, and then the tray 50 supporting unprocessed workpieces 80 is loaded by the bottom transport rollers 90a, 91a.

During the operations for loading and unloading trays 50 between the processing chamber 10 and first load lock chamber 12, the lifting/lower stage 70 of the processing chamber 10 is positioned below the bottom transport rollers 92a, 93a. When the tray 50 has been loaded into the processing chamber 10, the tray 50 is carried to processing position above the top transport rollers 92b, 93b. The lifting/lowering stage 70 and the drive unit that lifts and lowers the lifting/lowering stage constitutes a lifting/lowering means.

FIG. 1 shows a tray 50 lifted to the processing position by the lifting lowering stage 70. When the tray 50 is carried by the lifting/lowering stage, the top transport rollers 92b, 93b are horizontally diverted so that tray 50 does not clash with the transport rollers 92b, 93b. The movement of the transport rollers 92b, 93b is performed by the drive units 100, 101.

The required process is performed to the workpieces 80 with the tray supported in the top position by the lifting/lowering stage.

In this embodiment, unlike the previously described embodiment, the operation to transfer the tray 50 from the carrier 54 to the lifting/lowering stage 70 is not performed. Consequently, it is possible for the gate valve 16b to immediately close when the unprocessed workpieces 80 have been introduced to the processing chamber 10, and shift to the operation for carrying the tray 50 with the lifting/lowering stage 70.

In plasma film-forming processes, about 10 seconds are required from the closing of the gate valve 16b to normalize the gas environment by supplying gas to the processing chamber 10. Consequently, within this time, if the lifting/lowering stage 70 is lifted to the processing position, then the time to move the lifting/lowering stage 70 has no effect on the cycle time.

In addition, after the film-forming process has been performed on the workpieces 80, then by lowering the lifting/lowering stage 70 with the top transport rollers 92b, 93b returned to the transport position (original position) while the tray 50 remains on the lifting/lowering stage 70, it is possible to transfer the tray 50 to the top transport rollers 92b, 93b. Even in this case, after a plasma process has been performed, about 10 seconds is required to release (purge) gas from the processing chamber 10. Consequently, within this time, the tray may be transferred to the top transport rollers 92b, 93b.

The rotating shaft 96b of the transport roller 92b engages the gear 97b via the spline shaft 98, so the synchronized rotation of the bottom and top transport rollers 92a, 92b is maintained.

The unprocessed workpieces 80 loaded from the load lock chamber 12 into the processing chamber 10, after being processed in the processing chamber 10, are unloaded to the second load lock chamber 14. The operation to load and unload trays 50 between the processing chamber 10 and second load lock chambers 14 is the same as the operation to load and unload trays 50 between the processing chamber 10 and the first load lock chamber 12. In addition, the operation to load and unload trays between the second load lock chamber 14 and the second port 42 is also the same as the operation to load and unload trays 50 between the first load lock chamber 12 and the first port 40.

Thus, workpieces 80 loaded from the first load lock chamber into the processing chamber 10, after processing, are unloaded to the second load lock chamber 14, and conversely, workpieces 80 loaded from the second load lock chamber 14 to the processing chamber 10, after processing, are unloaded to the first load lock chamber 12. That is, unprocessed workpieces 80 and processed workpieces are moved so that they intersect in the processing chamber 10, and loading and unloading operations are performed.

In either the first port 40 or second port 42, workpieces 80 are adsorbed and supported by the adsorption pads 76 from the tray 50 supported by the top transport rollers 90b, 91b, 94b and 95b, and while the moving frame 75 is moved along the guide rails 74, the processed workpieces 80 are ultimately housed in the housing unit E.

Next, unprocessed workpieces 80 are supplied from the supply unit D to the tray 50, and while the tray 50 is supported by the lifting/lowering stage 72, the top transport rollers 90b, 91b, 94b and 95b are moved to a horizontal avoidance position, the lifting/lowering stage 72 is lowered, and the tray 50 is transferred to the bottom transport rollers 90a, 91a, 94a and 95a. The operation to transfer the tray 50 from the top to bottom transport rollers by this lifting/lowering stage 72 also can shorten the transport time in comparison to methods using a carrier 54.

Furthermore, various methods are available for housing processed workpieces 80 in the housing unit E in the first port 40 and second port 42, and newly supplying unprocessed workpieces 80 to the tray 50, and they are not limited to the one described above. For example, there are also methods in which a plurality of trays 50 for transport are prepared, unprocessed workpieces 80 are arranged and prepared on the trays 50 beforehand, and then these trays 50 are sequentially supplied according to the transport operation.

In addition, this embodiment is constituted so that unprocessed workpieces are supplied by the bottom transport rollers, and processed workpieces are supplied by the top transport rollers, but conversely, it may also be constituted so that processed workpieces are supplied by the bottom transport rollers, and the unprocessed workpieces are supplied by the top transport rollers. In this case, in the processing chamber 10, the tray 50 may be lifted from the top transport rollers to the processing position, and then after processing, the processed tray may be lowered to the bottom transport lower position.

Cycle Time

As described above, in the processor in this embodiment, by omitting the operation to transfer trays 50 to and from the carriers 54, it is possible to reduce the time required for the operations to load and unload workpieces to and from the processing chamber. These loading and unloading operations are part of the exchange operation in the timing chart shown in FIG. 7.

In conventional transport methods, the time required when loading and loading workpieces to and from the processing chamber is as follows.
(1) Time to open gate valve: 2 seconds
(2) Time to load trays together with carriers into processing chamber: 4 seconds (3) Time to transfer unprocessed trays from the carriers to the lifting/lowering stage (transfer processed tray to carrier): 4 seconds
(4) Time to unload carriers from processing chamber: 3 seconds
(5) Time to close gate valve: 2 seconds
Total time is 15 seconds.

In the processor in this embodiment, the time required to load and unload workpieces to and from the processing chamber is as follows.
(1) Time to open gate valve: 2 seconds
(2) Time to load trays into processing chamber, and unload trays from processing chamber: 4 seconds
(3) Time to close gate valve: 2 seconds
Total time is 8 seconds.

Although there are differences depending on the details of product processing, in an example of a film-forming process for a solar battery, once the processing chamber gate valve has been opened, the film-forming process is performed, and approximately 50 seconds elapses before the gate vale is opened (gas normalization: 10 seconds, plasma treatment: 30 seconds, gas purge: 10 seconds). Consequently, in this example, if the processor is of the first embodiment, then although one cycle time is 50 seconds+15 seconds=65 seconds, with a processor of this embodiment, it is shortened to 50 seconds+8 seconds=58 seconds. In this case, the cycle time is reduced by about 10%. In the case of mass-produced products, an improved production efficiency of 10% is quite important. In addition, if the processing time for workpieces is even shorter, then if the processing time was 30 seconds, for example, the cycle time reduction rate would be about 15%. With a process of this embodiment, by using a method wherein alternately unprocessed workpieces 80 are supplied and workpieces 80 are processed from the first load lock chamber 12 and the second load lock chamber 14, even if the processing time for workpieces in the processing chamber 10 is short, it is possible to supply workpieces 80 with time to spare, it is possible to prevent productivity from being restricted by the transport system to supply the workpieces, and, it is possible to efficiently improve productivity by making the transport operation for workpieces 80 more efficient.

The invention claimed is:

1. A processor for processing workpieces, comprising:
a processing chamber provided with a first supply/discharge port and a second supply/discharge port, which are each used to load unprocessed workpieces and unload processed workpieces,
a first transport means comprising a top and bottom support shelves and configured to perform an operation to load unprocessed workpieces into the processing chamber from one of the top and bottom support shelves, via the first supply/discharge port, and an operation to unload processed workpieces from the processing chamber to other one of the top and bottom support shelves,
a second transport means comprising a top and bottom support shelves and configured to perform an operation to load unprocessed workpieces into the processing chamber from one of the top and bottom support shelves, via the second supply/discharge port, and an operation to unload processed workpieces from the processing chamber to other one of the top and bottom support shelves,
an exchange means configured to deliver workpieces loaded into the processing chamber by the first transport mechanism to the second transport mechanism, and deliver workpieces loaded into the processing chamber by the second transport mechanism to the first transport mechanism,
and a control unit to control the first transport mechanism, second transport mechanism and exchange means, and alternately perform supply/discharge operations for workpieces in the first supply/discharge port and second supply/discharge port.

2. A processor as described in claim 1, further comprising:
a first load lock chamber provided leading to the first supply/discharge port of the processing chamber, and
a second load lock chamber provided leading to the second supply/discharge port of the processing chamber,
and wherein workpieces are being supplied to and discharged from the processing chamber via the first load lock chamber and second load lock chamber.

3. A processor as described in claim 2, wherein the first load lock chamber, the processing chamber, and the second load lock chamber are being disposed in series.

4. A processor as described in claim 2, further comprising:
a first port for performing the loading of unprocessed workpieces and the unloading of processed workpieces to and from the first load lock chamber,
and a second port for performing the loading of unprocessed workpieces and the unloading of processed workpieces to and from the second load lock chamber,
wherein the first transport mechanism transports workpieces between the first port and processing chamber, and the second transport mechanism transports workpieces between the second port and processing chamber.

5. A processor as described in claim 2, further comprising a processing control unit to control the processing in said processing chamber, and a vacuum device to vacuum pump the load lock chambers.

6. A processor as described in claim 1, wherein the first transport mechanism and second transport mechanism comprise carriers equipped with support shelves to support unprocessed workpieces and processed workpieces at different heights.

7. A processor as described in claim 6, further comprising trays to support the workpieces, the trays being supported by the support shelves of the carriers.

8. A processor as described in claim 7, wherein the trays comprise carbon trays.

9. A processor of substrate as described in claim 6, further comprising: a moving means to move the workpieces from the support shelves to a workpiece processing position, and to transfer processed workpieces to support shelves at a height position different from the support shelves wherein workpieces are supported during the workpiece loading.

10. A processor as described in claim 6, wherein the first port and second port further comprise,
a housing means to house processed workpieces from the carriers in a housing unit,
and a supply means to supply unprocessed workpieces to the carriers.

11. A processor as described in claim 1, further comprising:
bottom transport rollers and top transport rollers to transport workpieces at different height positions, and a driving mechanism to drive the bottom transport rollers and top transport rollers.

12. A processor as described in claim 11, wherein each of the first transport mechanism and the second transport mechanism includes bottom transport rollers and top transport rollers, and bottom transport rollers and top transport rollers disposed inside the processing chamber.

13. A process as described in claim 12, further comprising a driving mechanism that alternately reverse drives the transport direction, according to the operation whereby the bottom transport rollers and top transport rollers deliver and discharge workpieces via the first supply/discharge port and second supply/discharge port.

14. A processor as described in claim 13, further comprising a controller for the driving mechanism that, when performing operations to supply and discharge workpieces via the first supply/discharge port, synchronizes the bottom and top transport rollers of the first transport mechanism, and when performing operations to supply and discharge workpieces via the second supply/entry port, synchronizes and drives the bottom and top transport rollers of the second transport mechanism.

15. A processor as described in claim 11, further comprising:
 a first load lock chamber being provided leading to the first supply/discharge port of the processing chamber,
 a second load lock chamber being provided leading to the second supply/discharge port of the processing chamber,
 bottom transport rollers and top transport rollers being provided in the first load lock chamber,
 bottom transport rollers and top transport rollers being provided in the second load lock chamber.

16. A processor as described in claim 11, further comprising:
 a first port to perform loading of unprocessed workpieces and unloading of processed workpieces to and from the first load lock chamber,
 and a second port to perform loading of unprocessed workpieces and unloading of processed workpieces to and from the second load lock chamber,
 bottom transport rollers and top transport rollers being provided across the first load lock chamber and the first port,
 and bottom transport rollers and top transport rollers being provided across the second load lock chamber and the second port.

17. A processor as described in claim 16, wherein the first port and second port, include a lifting/lowering means to lift and lower workpieces between a transport height position and a workpiece transfer position,
 and an avoidance means to divert the top transport rollers disposed in the first port and second port to a position that does not clash with the workpieces, when lifting and lowering workpieces with said lifting/lowering means.

18. A processor as described in claim 11, wherein the processing chamber including a lifting/lowering means as the exchange means to lift and lower workpieces between a transport height position and a workpiece processing position.

19. A processor as described in claim 18, further comprising an avoidance mechanism to divert the top transport rollers disposed on the processing chamber to a position that does not clash with the workpieces, when lifting and lowering workpieces with said lifting/lowering means.

20. A processor as described in claim 11, further comprising trays to support the workpieces, and wherein the first transport mechanism and second transport mechanism including a mechanism to support the trays.

21. A processor as described in claim 11, wherein each set of transport roller are transporting workpieces in the opposite direction of the other.

22. A processor as described in claim 1, further comprising:
 a first load lock chamber being provided leading to the first supply/discharge port,
 a second load lock chamber being provided leading to the second supply/discharge port,
 each of the first load lock chamber and the second load lock chamber being equipped with bottom transport rollers and top transport rollers to transport workpieces at different height positions,
 and a driving mechanism to drive the bottom transport rollers and top transport rollers.

23. A processor as described in claim 22, further comprising:
 a controller that, when performing operations to supply and discharge workpieces via the first supply/entry port, synchronizes the bottom and top transport rollers disposed in the first load lock chamber, and when performing operations to supply and discharge workpieces via the second supply/entry port, synchronizes and drives the bottom and top transport rollers disposed in the second load lock chamber.

24. A processor as described in claim 22 wherein the driving mechanism drives the bottom transport rollers and top transport rollers to alternately transport workpieces to the processing chamber from the first supply/discharge port and the second supply/discharge port.

25. A processor as described in claim 22, wherein the processing chamber includes bottom transport rollers and top transport rollers.

26. A processor as described in claim 25, wherein the first load lock and the second load lock are disposed at positioned on both sides of the processing chamber, with the processing chamber interposed in between.

\* \* \* \* \*